(12) United States Patent
Kaya

(10) Patent No.: US 9,983,233 B2
(45) Date of Patent: May 29, 2018

(54) CURRENT SENSOR

(71) Applicant: Texas Instruments Incorporated, Dallas, TX (US)

(72) Inventor: Cetin Kaya, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 408 days.

(21) Appl. No.: 14/611,427

(22) Filed: Feb. 2, 2015

(65) Prior Publication Data

US 2015/0219690 A1 Aug. 6, 2015

Related U.S. Application Data

(60) Provisional application No. 61/936,587, filed on Feb. 6, 2014.

(51) Int. Cl.
G01R 1/20 (2006.01)
G01R 19/00 (2006.01)
H03F 1/30 (2006.01)

(52) U.S. Cl.
CPC ......... *G01R 1/203* (2013.01); *G01R 19/0092* (2013.01); *H03F 1/301* (2013.01)

(58) Field of Classification Search
CPC . H03F 1/30; H03F 1/301; H03F 1/302; H03F 2200/447; G01R 1/203; G01R 1/44; G01R 19/0092; G01R 19/32; G01R 21/14
See application file for complete search history.

(56) References Cited

U.S. PATENT DOCUMENTS

| 4,591,743 | A  | * | 5/1986  | Kung    | G05F 3/30     |
|           |    |   |         |         | 307/651       |
| 6,608,470 | B1 | * | 8/2003  | Oglesbee| H01M 2/348    |
|           |    |   |         |         | 320/135       |
| 7,683,604 | B1 | * | 3/2010  | Steele  | G01R 1/30     |
|           |    |   |         |         | 324/123 R     |
| 2009/0296285 | A1 | * | 12/2009 | Araki | G01R 33/0023  |
|           |    |   |         |         | 360/324       |
| 2010/0071947 | A1 | * | 3/2010  | Nakai | H05K 1/181    |
|           |    |   |         |         | 174/260       |
| 2011/0089931 | A1 | * | 4/2011  | Podlisk | G01R 1/203  |
|           |    |   |         |         | 324/126       |
| 2011/0297362 | A1 | * | 12/2011 | Chrysler | F28D 15/0233|
|           |    |   |         |         | 165/185       |
| 2014/0035605 | A1 | * | 2/2014  | Kurz | G01R 27/02    |
|           |    |   |         |         | 324/713       |

* cited by examiner

Primary Examiner — Huy Q Phan
Assistant Examiner — Dustin Dickinson
(74) Attorney, Agent, or Firm — John R. Pessetto; Charles A. Brill; Frank D. Cimino

(57) ABSTRACT

A current sensor includes a die and a shunt resistor having a first temperature coefficient and having a first node and a second node fabricated onto the die, wherein the shunt resistor is for passing the current that is to be sensed. A first compensation resistor is fabricated onto the die and is coupled to the first node of the shunt resistor, wherein the first compensation resistor is proximate the shunt resistor and has a temperature coefficient that is similar to the temperature coefficient of the shunt resistor. A second compensation resistor is fabricated onto the die and is coupled to the second node of the shunt resistor, wherein the second compensation resistor is proximate the shunt resistor and has a temperature coefficient that is the close to the temperature coefficient of the shunt resistor.

7 Claims, 2 Drawing Sheets

CURRENT SENSOR

This application claims priority to U.S. provisional patent application 61/936,587 of Cetin Kaya, filed on Feb. 6, 2014, for TEMPERATURE COMPENSATED EXTERNAL CURRENT SENSING METHOD, which is incorporated for all that is disclosed.

BACKGROUND

Shunt resistors are coupled in series with a conductor to measure the current flow through the conductor. The current flow through a shunt resistor generates a voltage that is proportional to the current flow. Measurement devices are coupled to the shunt resistor to measure the voltage across the shunt resistor and to provide an indication of the current flow through the conductor based on the generated voltage. Shunt resistors inherently cause a loss in the system in which they are coupled because they consume power when generating the voltage. Accordingly, the resistance values of shunt resistors are designed to be very low when they are used in situations where high current is measured.

Shunt resistors are typically made of a highly conductive metal, such as copper, to reduce the inherent loss of the shunt resistors. For example, a highly conductive shunt resistor, such as a copper shunt resistor, does not significantly alter the current flow in the system in which it is measuring current. However, one of the problems with a copper shunt resistor is the temperature coefficient of copper is approximately 4000 ppm/° C. Therefore, a temperature change of 100° C. changes the resistance of a copper shunt resistor by 40%. Accordingly, copper shunt resistors do not provide accurate current measurements when they are subjected to temperature changes.

SUMMARY

A current sensing device includes a die and a shunt resistor having a first temperature coefficient and having a first node and a second node fabricated onto the die, wherein the shunt resistor is for passing the current that is to be sensed. A first compensation resistor is fabricated onto the die and is coupled to the first node of the shunt resistor, wherein the first compensation resistor is located proximate the shunt resistor and is maintained at approximately the same temperature as the shunt resistor by way of the proximity. The first compensation resistor has a temperature coefficient that is close to the temperature coefficient of the shunt resistor. A second compensation resistor is fabricated onto the die and is coupled to the second node of the shunt resistor, wherein the second compensation resistor is located proximate the shunt resistor and is maintained at approximately the same temperature as the shunt resistor by way of the proximity. The second compensation resistor has a temperature coefficient that is the close to the temperature coefficient of the shunt resistor.

In some aspects of the current sensing device, a voltage measuring device is coupled to a node of the first compensation resistor opposite the shunt resistor and a node of the second compensation resistor opposite the shunt resistor. The voltage measuring device generates an output that is proportional to the voltage drop across the shunt resistor. The voltage measuring device includes devices that generate a current that is proportional to the voltage drop across the shunt resistor.

Some aspects of the current sensing device include an amplifier coupled to the voltage measuring device, wherein the amplifier provides temperature compensation. The temperature compensation may include compensating for the difference in temperature coefficients of the shunt resistor and the compensation resistors. The amplifier may include a current-to-voltage converter.

Some aspects of the shunt resistor have a first surface and wherein the first compensation resistor and the second compensation resistor are located adjacent the first surface. At least one thermal via may extend from the shunt resistor and be located proximate the first compensation resistor and/or the second compensation resistor. Other aspects of the current sensing device include a metal layer in the die, wherein the metal layer has a first surface facing a first surface of the shunt resistor, and wherein the first compensation resistor and the second compensation resistor are located between the first surface of the shunt resistor and the first surface of the metal layer. A thermal via may extend between the first surface of the shunt resistor and the first surface of the metal layer and may be located proximate the first compensation resistor and/or the second compensation resistor.

In some aspects of the current sensor, the temperature coefficient of the shunt resistor is substantially the same as the temperature coefficients of the first compensation resistor and the second compensation resistor. In some related aspects, the shunt resistor, the first compensation resistor, and the second compensation resistor all comprise substantially the same material. In other aspects, the shunt resistor comprises primarily copper. In yet another related aspect, the first compensation resistor and the second compensation resistor comprise primarily aluminum.

Another embodiment of the current sensor includes a die and a shunt resistor having a first temperature coefficient and having a first node and a second node fabricated onto the die, wherein the shunt resistor is for passing the current that is to be sensed. A metal layer is also fabricated into the die. A first compensation resistor is fabricated onto the die between the shunt resistor and the metal layer and is coupled to the first node of the shunt resistor. During operation, the first compensation resistor has a temperature coefficient that is close to the temperature coefficient of the shunt resistor. A second compensation resistor is fabricated onto the die between the shunt resistor and the metal layer and is coupled to the second node of the shunt resistor. The second compensation has a temperature coefficient that is close to the temperature coefficient of the shunt resistor.

In some aspects of the current sensor, at least one thermal via extends between the shunt resistor and the metal layer and is located proximate at least one of the first compensation resistor and the second compensation resistor. In some aspects, the shunt resistor comprises primarily copper. And in other aspects, the first compensation resistor and the second compensation resistor comprise primarily aluminum.

Another embodiment of a current sensor includes a die and a shunt resistor having a first temperature coefficient and having a first node and a second node fabricated onto the die, wherein the shunt resistor is for passing the current that is to be sensed. A metal layer is also fabricated into the die. A first compensation resistor is fabricated onto the die between the shunt resistor and the metal layer and is coupled to the first node of the shunt resistor. The first compensation resistor has a temperature coefficient that is close to the temperature coefficient of the shunt resistor. A second compensation resistor is fabricated onto the die between the shunt resistor and the metal layer and is coupled to the second node of the shunt resistor. The second compensation resistor has a temperature coefficient that is close to the temperature coefficient of the shunt resistor. A voltage-to-current converter is coupled to the first compensation resistor and the second compensation resistor and is for converting voltages at the first compensation resistor and the second compensation resistor to a differential current. A current-to-voltage converter is coupled to the voltage-to-current converter and is for converting the differential current to a voltage indicative of the sensed current.

DETAILED DESCRIPTION

Figure 1:
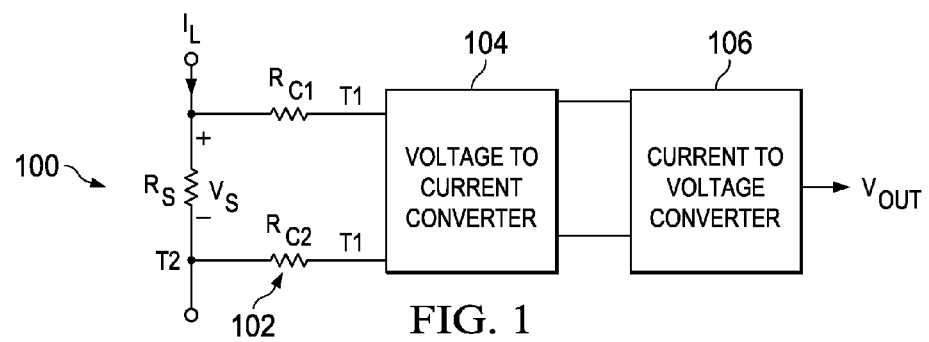
FIG. 1 is a block diagram of an example of a current sensor.

FIG. 1 is a block diagram of an example of a current sensor 100 that measures a current referred to as a load current $I_L$. In some aspects of the current sensor 100, the load current $I_L$ is as high as twelve amperes. In other aspects of the current sensor 100, the load current $I_L$ has different maximum values and is a design choice. The load current $I_L$ is generated in a circuit (not shown), that in some aspects, is independent from the current sensor 100. For example, in some aspects, the load current $I_L$ is generated on a circuit that is separate from a die or other substrate on which the current sensor 100 is located.

The load current $I_L$ flows through a shunt resistor $R_S$ and generates a shunt voltage $V_S$. In some of the examples described herein, the shunt resistor $R_S$ is fabricated on a die of an integrated circuit (not shown in FIG. 1). In other examples of the current sensor 100, the shunt resistor $R_S$ is a discrete component. The shunt resistor $R_S$ is fabricated from at least one low resistance material, such as copper, so that it does not present a significant load on the devices that generate the load current $I_L$. More specifically, the resistance of the shunt resistor $R_S$ is low enough so as not to significantly affect the load current $I_L$. In some aspects of the current sensor 100, the shunt resistor $R_S$ has a value of approximately 5 mΩ. The shunt voltage $V_S$ generated across the shunt resistor $R_S$ is proportional to the load current $I_L$ and provides an indication of the load current $I_L$.

One of the problems with shunt resistors is that they need to have low resistance to minimize power losses, so they are fabricated with at least one low resistance material, such as copper or aluminum. However, the low resistance materials have high temperature coefficients, so their resistances are a function of temperature. For example, the temperature coefficient of copper, which provides very low resistance, is approximately 4000 ppm/° C., so a 100° C. temperature change results in a 40% resistance change. The temperature coefficient of aluminum is approximately 3500 ppm/° C., so a 100° C. change in temperature results in a 35% change in resistance. The resistance variations with temperature result in inaccurate current measurements when the temperature of the shunt resistor changes. Moreover, shunt resistors typically pass high current, so they tend to heat up in use and the shunt resistors may be located in areas proximate heat sources, so the temperatures of the shunt resistors are susceptible to temperatures variations. The temperature variations change the resistance of the shunt resistor $R_S$ and result in inaccurate load current $I_L$ measurements. The circuits and methods described herein overcome problems with the inaccuracies in load current $I_L$ measurements resulting from temperature variations.

The current sensor 100 of FIG. 1 includes two compensation resistors 102, which are referred to as the compensation resistor $R_{C1}$ and the compensation resistor $R_{C2}$, wherein one compensation resistor is coupled to each side or node of the shunt resistor $R_S$. The resistances of the compensation resistors 102 are substantially higher than the resistance of the shunt resistor $R_S$, so that the compensation resistors 102 do not affect the current flow through the shunt resistor $R_S$. In some aspects of the current sensor 100, the compensation resistors 102 each have a resistance of approximately 500Ω. The compensation resistors 102 have thermal coefficients that are equal to or close to the thermal coefficient of the shunt resistor $R_S$. In addition, the compensation resistors 102 are maintained at the same temperature or approximately the same temperature as the shunt resistor $R_S$. It follows that the resistance of the compensation resistors 102 and the resistance of the shunt resistor $R_S$ change by the same proportion with changes in temperature, which compensates for the resistance change of the shunt resistor $R_S$ due to the temperature change.

In the example of FIG. 1, the compensation resistors 102 are coupled to a voltage-to-current converter 104. The voltage-to-current converter 104 converts the voltage generated across the shunt resistor $R_S$, in response to the load current $I_L$, to a differential current. In some aspects of the current sensor 100, the voltage-to-current converter 104 electrically floats and/or operates at a relatively high voltage. The voltage-to-current converter 104 is coupled to a current-to-voltage converter 106 that outputs a signal, such as a voltage, that is indicative of the load current $I_L$. In some aspects of the current sensor 100, the current-to-voltage converter 106 operates at a voltage that is lower than the operating voltage of the voltage-to-current converter 104. In other aspects of the current sensor 100, the current-to-voltage converter 106 includes additional temperature compensation as described below. The additional temperature compensation compensates for the different temperature coefficients of the shunt resistor $R_S$ and the compensation resistors 102.

Figure 2:
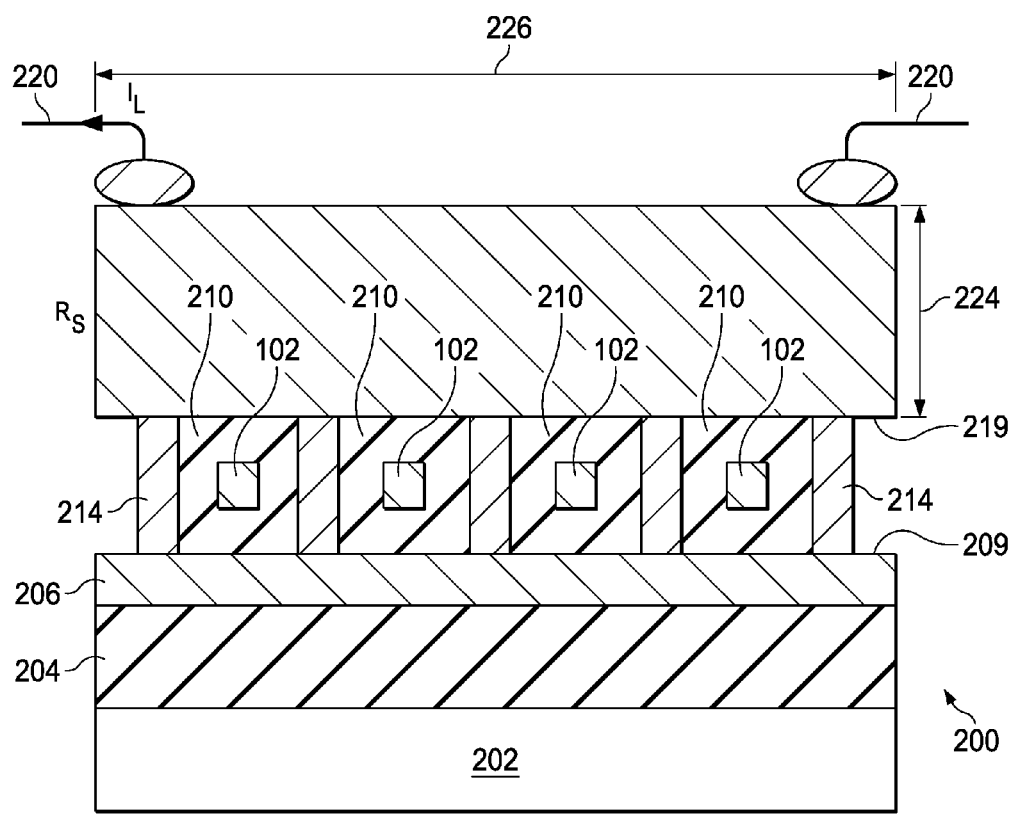
FIG. 2 is a cut away plan view of an example of a configuration of the shunt resistor and the compensation resistors of FIG. 1.

FIG. 2 is a cut away plan view of an example of the configuration of the shunt resistor $R_S$ and the compensation resistors 102 of FIG. 1. The shunt resistor $R_S$ and the compensation resistors 102 are fabricated on a die 200 of an integrated circuit. In the example of FIG. 2, the die 200 includes a substrate 202, such as a silicon substrate. An inter-level dielectric 204 is fabricated onto the substrate 202. A shield 206, such as a metal shield or layer, is fabricated onto the inter-level dielectric 204. The use of metal as the shield 206 provides good thermal characteristics to transfer heat to the shunt resistor $R_S$ and the compensation resistors 102 as described further below. The metal shield 206 also eliminates any electrical coupling from the substrate 202 to the compensation resistors 102, which can corrupt the measurements of the load current $I_L$.

The compensation resistors 102 are fabricated proximate the shield 206 and in some aspects of the die 200, the compensation resistors 102 are encased in an electric insulator 210. The electric insulator 210 does not provide significant thermal insulation, so the compensation resistors 102 are the same temperature or close to the same temperature as the shunt resistor $R_S$ by way of their proximity to the shunt resistor $R_S$. The compensation resistors 102 typically have much higher resistance than the shunt resistor $R_S$, so they may wrap several times on the shield 206 as shown in FIG. 2. In the example of FIG. 2, the shunt resistor $R_S$ is fabricated on top of the compensation resistors 102 or the insulator 210. Because the shunt resistor $R_S$ is located in close proximity to the compensation resistors 102, they will all be at approximately the same temperature. In the example of FIG. 2, thermal vias 214 extend between the shield 206 and the shunt resistor $R_S$ and proximate the compensation resistors 102. The thermal vias 214 are fabricated from a metal or the like that readily conducts heat and serves to further maintain the shunt resistor $R_S$ and the compensation resistors 102 at the same temperature. Conductors 220 are electrically connected to the shunt resistor $R_S$ to carry the load current $I_L$.

The dimensions and materials of the die 200 are design choices. In some aspects of the die 200, the shunt resistor $R_S$ is fabricated primarily from copper because copper provides very low resistance. In other aspects of the die 200, the compensation resistors 102 are fabricated primarily from aluminum because aluminum has higher sheet resistance than copper, which is preferred in some aspects of the compensation resistors 102, and the temperature coefficient of aluminum is close to that of copper. In some aspects of the shunt resistor $R_S$, it has a height 224 of approximately 10 um, a length 226 of approximately 1500 um, and a width (not shown in FIG. 2) of approximately 750 um, which yields a resistance of approximately 5 mΩ. In some examples, the compensation resistors 102 have heights and widths of about 0.5 um and lengths of a few millimeters, yielding resistances of approximately 500Ω.

The layout of the die 200 of FIG. 2 is one of many different layouts of the shunt resistor $R_S$ and the compensation resistors 102. In most layouts, the purpose is to maintain the shunt resistor $R_S$ at the same temperature as the compensation resistors 102. Accordingly, other heat transfer techniques may be incorporated into the layout or other devices may be located between the shunt resistor $R_S$ and the compensation resistors 102 to conduct heat. In yet other aspects of the die 200, the shunt resistor $R_S$ is located proximate the compensation resistors 102, such that they are side by side, so that they maintain the same temperature.

Figure 3:
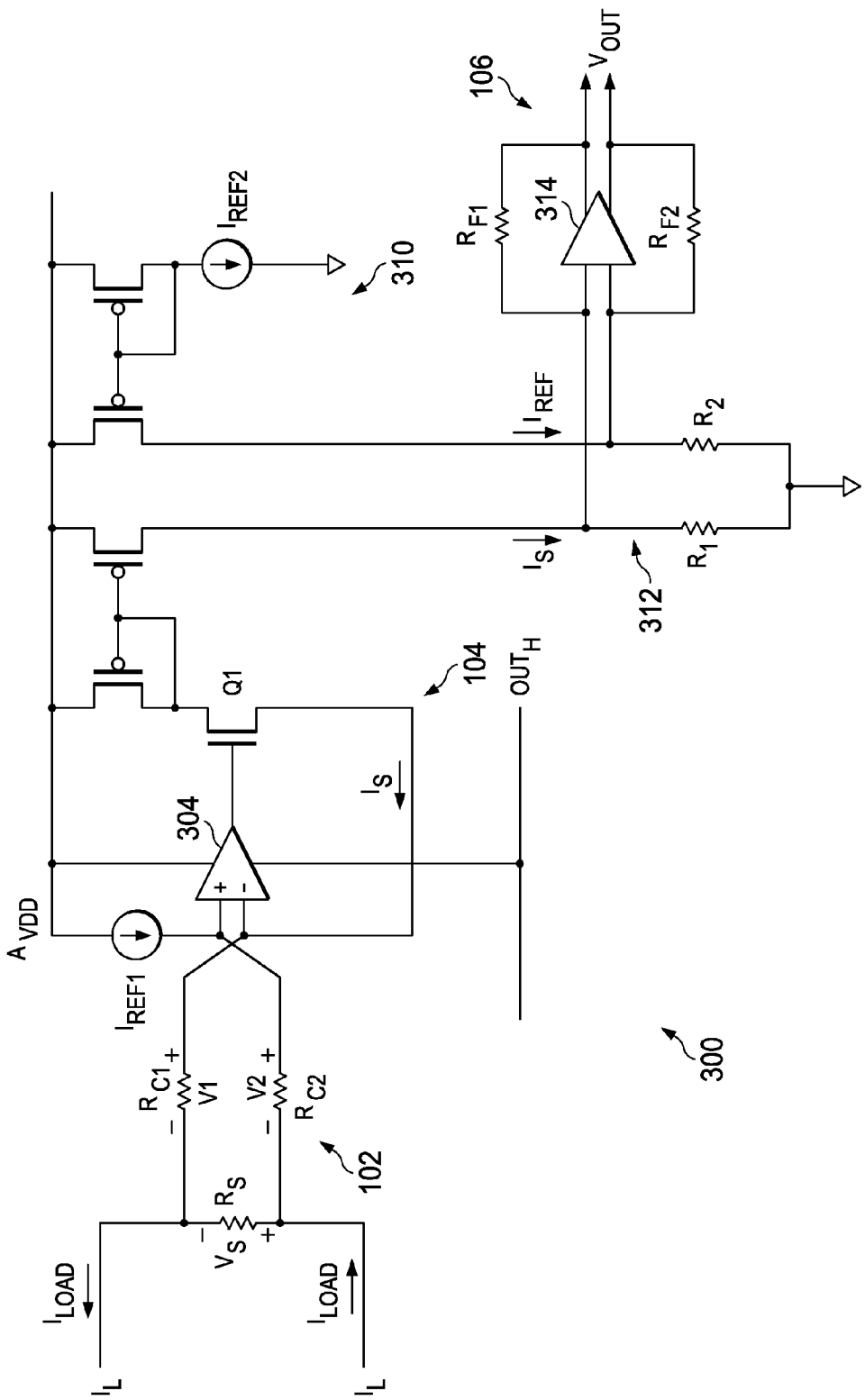
FIG. 3 is a detailed schematic diagram of an example of a current sensor.

FIG. 3 is a detailed schematic diagram of an example of a current sensor 300. The current sensor 300 is similar to the current sensor 100, but FIG. 3 provides a more detailed schematic diagram. The voltage-to-current converter 104 includes an operational amplifier 304 that has an inverting input and a non-inverting input. The compensation resistor $R_{C1}$ is coupled to the inverting input and the compensation resistor $R_{C2}$ is coupled to the non-inverting input. A reference current source $I_{REF1}$ is also coupled to the non-inverting input. The operational amplifier 304 serves as a differential amplifier and amplifies the voltage drop across the shunt resistor $R_S$ in response to the load current $I_L$. A transistor Q1 provides feedback to the inverting input of the operational amplifier 304.

In the example of FIG. 3, the current sensor 300 electrically floats, which enables the current sensor 300 to sense currents generated in relatively high voltage circuits. As shown in the example of FIG. 3, the operational amplifier 304 is powered between a voltage potential $A_{VDD}$ and a voltage potential $OUT_B$, which is the output of an H-bridge (not shown). The H-bridge is coupled to a circuit, or a portion of a circuit, that generates the load current $I_L$ and operates at a high voltage, such as 65V. By floating the current sensor 300, the components of the current sensor 300 that normally operate at a few volts are coupled to the higher voltage H-bridge.

The voltage-to-current converter 104 includes a current mirror 310 that outputs a differential current, wherein the differential current is proportional to or indicative of the shunt voltage $V_S$ across the shunt resistor $R_S$. The differential current includes a sense current $I_S$ and a reference current $I_{REF}$, which is equal to a reference current $I_{REF2}$. The current $I_{REF1}$ is also equal to the current $I_{REF}$ by generating the current $I_{REF1}$ from the current $I_{REF2}$ by way of a current mirror, which is not shown in FIG. 3. The differential current is received at the input 312 of the current-to-voltage converter 106 where it flows through two resistors R1 and R2. The resistors R1 and R2 are coupled to a differential amplifier 314 that amplifies the voltages generated by the differential current flowing through the resistors R1 and R2. In the example of FIG. 3, the resistors R1 and R2 have the same values.

The differential amplifier 314 has feedback resistors $R_{F1}$ and $R_{F2}$ coupled between the outputs of the differential amplifier 314 and the input 312 of the current-to-voltage converter 106. In some aspects of the current sensor 300, the feedback resistors $R_{F1}$ and $R_{F2}$ in the current-to-voltage converter 106 further compensate for different temperature coefficients of the shunt resistor $R_S$ and the compensation resistors 102. The feedback resistors $R_{F1}$ and $R_{F2}$ have the same resistance values and their temperature coefficients are the same. For example, the resistors $R_{F1}$ and $R_{F2}$ may be polysilicon resistors, which have a temperature coefficient of approximately –300 ppm/° C. The secondary temperature compensation provided by the current-to-voltage converter 106 further reduces the adverse affects of temperature on the current measurements. In some examples, the effects of a 100° C. temperature change result in a 3.7% change in current measurement with only the temperature compensation provided by the voltage-to-current sensor 104 and a 0.7% change with the additional temperature compensation provided by the current-to-voltage converter 106.

The current-to-voltage converter 106 generates an output voltage $V_{OUT}$ that is proportional to the load current $I_L$ and is the output of the current sensor 300. The above described temperature compensation techniques enable the output voltage $V_{OUT}$ to remain proportional to the load current $I_L$ irrespective of temperature variations.

The operation of the current sensor 300 will now be described in greater detail. The shunt resistor $R_S$ is located in close proximity to the compensation resistors 102 and they are all maintained at the same temperature by way of their proximity. The load current $I_L$ is generated in a circuit (not shown) that has an H-bridge output, which provides power to the components of the current sensor 300. The load current $I_L$ flows through the shunt resistor $R_S$ and generates the shunt voltage $V_S$. The resistance of the shunt resistor $R_S$ is temperature sensitive, so changes in temperature cause significant changes in the shunt voltage $V_S$. The resistance of the shunt resistor $R_S$ is very low so that the load current $I_L$ does not cause any appreciable heating to the shunt resistor $R_S$.

The amplifier 304 is coupled to the gate of the transistor Q1, which passes the sense current $I_S$ in response to the voltage potentials at the inverting and non-inverting inputs of the amplifier 304. The voltage V2 across the resistors $R_{C2}$ is defined by equation (1) as follows, which has been simplified so that $I_{REF}$, $I_{REF1}$, and $I_{REF2}$ are all equal using current mirrors or other circuitry, where B is the temperature coefficient of shunt resistor $R_S$, T2 is the temperature of shunt resistor $R_S$, $\alpha$ is the temperature coefficient of the compensation resistors 102, and T1 is the temperature of the compensation resistors 102:

$$V2 = I_{REF} R_{C2} = I_L R_S(1+BT_2) + I_S R_{C1}(1+\alpha T_1) \quad \text{Equation (1)}$$

The differential current input to the current-to-voltage converter 106 is defined by equation (2) as follows:

$$\text{Differential current} = I_L \frac{R_S}{R_{C1}} \frac{(1+\beta T_2)}{(1+\alpha T_1)} \quad \text{Equation (2)}$$

From equation (2) it can be seen that because the temperature coefficient of the shunt resistor $R_S$ is close to the temperature coefficients of the compensation resistors 102, the differential current is approximately equal to the value of the shunt resistor $R_S$ divided by the compensation resistor $R_{C1}$. The output voltage $V_{OUT}$ is a function of the differential voltage and is defined by equation (3) as follows:

$$V_{OUT} = \frac{R_S}{R_{C1}} \frac{(1+\beta T_2)}{(1+\alpha T_1)} R_P (1+\gamma T_0) \quad \text{Equation (3)}$$

where $R_P$ is the resistance of the feedback resistors $R_{F1}$ and $R_{F2}$, which are polysilicon; $\gamma$ is the temperature coefficient of polysilicon; and $T_0$ is the temperature of the polysilicon resistors $R_{F1}$ and $R_{F2}$.

As shown in equation (3), the effects of temperature variation are minimized by selecting $R_P$ such that $R_P(1+\gamma T_0)$ is equal to the inverse of $(1+\beta T_2)$ and $(1+\alpha T_1)$. Because the temperature coefficients $\alpha$ and $\beta$ are very close, the temperature coefficient $\gamma$ can be very small.

In other examples of the current sensor 300, the shunt resistor $R_S$ and the compensation resistors 102 are made from the same resistive material, such as copper or aluminum. By using the same resistive material, the temperature coefficients of the shunt resistor $R_S$ and the compensation resistors 102 are the same, so there is no error output by the voltage-to-current converter 104. Accordingly, the correction provided by the current-to-voltage converter 106 is not required. However, an aluminum shunt resistor $R_S$ has more resistance than a copper shunt resistor $R_S$ and is required to be very large in order to have a resistance low enough for some high current applications. Likewise, copper compensation resistors 102 have to be long so as to have resistances high enough that load current $I_L$ can be sensed easily.

The resistors described herein may have materials other than those described herein. For example, resistors having compositions of titanium, titanium nitride, titanium tungsten (TiW), and tungsten may be used in some embodiments. The shunt resistor $R_S$ and the compensation resistors may have the same temperature coefficients or temperature coefficients that are close to each other. By having temperature coefficients that are close to each other, there will be some error in the load current $I_S$ measurement. The selection of temperature coefficients may be performed so that the error is within predetermined limitations.

While illustrative and presently preferred embodiments of current sensors have been described in detail herein, it is to be understood that the concepts may be otherwise variously embodied and employed and that the appended claims are intended to be construed to include such variations except insofar as limited by the prior art.

What is claimed is:

1. A current sensing device comprising:
   a die;
   a shunt resistor having a first node and a second node and fabricated onto the die, the shunt resistor for passing a current to be sensed, the shunt resistor being fabricated from a first material having a first temperature coefficient;
   a first compensation resistor fabricated onto the die, the first compensation resistor coupled to the first node of the shunt resistor, wherein the first compensation resistor is proximate the shunt resistor and is maintained at approximately the same temperature as the shunt resistor by way of its proximity, and wherein the first compensation resistor has a temperature coefficient that is close to the temperature coefficient of the shunt resistor; and
   a second compensation resistor fabricated onto the die, the second compensation resistor coupled to the second node of the shunt resistor, wherein the second compensation resistor is proximate the shunt resistor and is maintained at approximately the same temperature as the shunt resistor by way of its proximity, and wherein the second compensation resistor has a temperature coefficient that is close to the temperature coefficient of the shunt resistor; and
   a metal layer in the die, the metal layer having a first surface facing a first surface of the shunt resistor, wherein the first compensation resistor and the second compensation resistor are located between the first surface of the shunt resistor and the first surface of the metal layer.

2. The current sensor of claim 1, further comprising at least one thermal via extending between the first surface of the shunt resistor and the first surface of the metal layer.

3. The current sensor of claim 2, wherein the at least one thermal via is located proximate the first compensation resistor and the second compensation resistor.

4. A current sensor comprising
   a die;
   a shunt resistor having a first node and a second node and fabricated onto the die, the shunt resistor for passing a current to be sensed, the shunt resistor being fabricated from a first material having a first temperature coefficient;
   a metal layer fabricated onto the die;
   a first compensation resistor fabricated onto the die between the shunt resistor and the metal layer, the first compensation resistor coupled to the first node of the shunt resistor, wherein the first compensation resistor has a temperature coefficient that is close to the temperature coefficient of the shunt resistor; and
   a second compensation resistor fabricated onto the die between the shunt resistor and the metal layer, the second compensation resistor coupled to the second node of the shunt resistor, wherein the second compensation resistor has a temperature coefficient that is close to the temperature coefficient of the shunt resistor.

5. The current sensor of claim 4 further comprising at least one thermal via extending between the shunt resistor and the metal layer and located proximate at least one of the first compensation resistor and the second compensation resistor.

6. The current sensor of claim 4, wherein the shunt resistor comprises primarily copper.

7. A current sensor comprising
   a die;
   a shunt resistor having a first node and a second node and fabricated onto the die, the shunt resistor for passing a current to be sensed, the shunt resistor being fabricated from a first material having a first temperature coefficient, and the shunt resistor having a first node and a second node;
   a metal layer fabricated into the die;

a first compensation resistor fabricated onto the die between the shunt resistor and the metal layer, the first compensation resistor coupled to the first node of the shunt resistor, wherein the first compensation resistor has a temperature coefficient that is close to the temperature coefficient of the shunt resistor;

a second compensation resistor fabricated onto the die between the shunt resistor and the metal layer, the second compensation resistor coupled to the second node of the shunt resistor, wherein the second compensation resistor has a temperature coefficient that is close to the temperature coefficient of the shunt resistor;

a voltage-to-current converter coupled to the first compensation resistor and the second compensation resistor, the voltage-to-current converter for converting voltages at the first compensation resistor and the second compensation resistor to a differential current; and a current-to-voltage converter coupled to the voltage-to-current converter, the current-to-voltage converter for converting the differential current to a voltage indicative of the sensed current.

\* \* \* \* \*